US011398610B2

(12) United States Patent
Abe

(10) Patent No.: US 11,398,610 B2
(45) Date of Patent: Jul. 26, 2022

(54) DISPLAY DEVICE AND METHOD OF MANUFACTURING DISPLAY DEVICE

(71) Applicant: SHARP KABUSHIKI KAISHA, Sakai (JP)

(72) Inventor: Kaoru Abe, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/042,860

(22) PCT Filed: Mar. 30, 2018

(86) PCT No.: PCT/JP2018/013807
§ 371 (c)(1),
(2) Date: Sep. 28, 2020

(87) PCT Pub. No.: WO2019/187067
PCT Pub. Date: Oct. 3, 2019

(65) Prior Publication Data
US 2021/0020855 A1    Jan. 21, 2021

(51) Int. Cl.
*H01L 51/00*    (2006.01)
*H01L 51/56*    (2006.01)
*B32B 3/26*    (2006.01)
*B32B 27/08*    (2006.01)
*B32B 27/28*    (2006.01)
*B32B 37/18*    (2006.01)
(Continued)

(52) U.S. Cl.
CPC ............ *H01L 51/0097* (2013.01); *B32B 3/02* (2013.01); *B32B 3/263* (2013.01); *B32B 7/04* (2013.01); *B32B 27/08* (2013.01); *B32B 27/281* (2013.01); *B32B 37/182* (2013.01); *H01L 51/56* (2013.01); *B32B 2457/206* (2013.01); *H01L 27/3244* (2013.01)

(58) Field of Classification Search
CPC .......... H01L 51/00; H01L 51/56; B32B 3/26; B32B 27/08; B32B 27/28; B32B 37/18; B32B 7/04; B32B 3/02
USPC ......................................................... 428/172
See application file for complete search history.

(56) References Cited

U.S. PATENT DOCUMENTS

2012/0327020 A1*  12/2012  Kohara ............... G02F 1/13338
                                                                 345/174
2015/0183932 A1*   7/2015  Katayama ............. B32B 27/281
                                                                  257/40
(Continued)

FOREIGN PATENT DOCUMENTS

JP    2013077382 A     4/2013
JP    2017-187705 A   10/2017

*Primary Examiner* — Tahseen Khan
(74) *Attorney, Agent, or Firm* — ScienBiziP, P.C.

(57) ABSTRACT

A display device includes a non-transmissive display section and a transmissive display section. The non-transmissive display section includes a base member including a first polyimide. The transmissive display section includes a base member including a second polyimide that has higher transparency than the first polyimide. The base member of the non-transmissive display section and the base member of the transmissive display section are connected in a connecting section. A bending portion is provided in the base member of the non-transmissive display section or the base member of the transmissive display section. The connecting section and the bending portion do not overlap each other.

7 Claims, 7 Drawing Sheets

(51) Int. Cl.
_B32B 7/04_ (2019.01)
_B32B 3/02_ (2006.01)
_H01L 27/32_ (2006.01)

(56) References Cited

U.S. PATENT DOCUMENTS

| | | | | |
|---|---|---|---|---|
| 2015/0279915 | A1* | 10/2015 | Morita | H01L 27/3213 |
| | | | | 257/88 |
| 2017/0023979 | A1* | 1/2017 | Yamazaki | H01L 51/5237 |
| 2017/0053953 | A1* | 2/2017 | Hirota | H01L 27/1218 |
| 2017/0123247 | A1* | 5/2017 | Hirota | G02F 1/1337 |
| 2017/0294621 | A1* | 10/2017 | Higano | H01L 51/5281 |

* cited by examiner

DISPLAY DEVICE AND METHOD OF MANUFACTURING DISPLAY DEVICE

TECHNICAL FIELD

The present invention relates to display devices and methods of manufacturing display devices.

BACKGROUND ART

Patent Literature 1 discloses technology related to display devices including a bendable base member.

CITATION LIST

Patent Literature

Patent Literature 1: Japanese Patent Application Publication No. 2017-187705

SUMMARY OF INVENTION

Technical Problem

A base member may be formed by connecting a plurality of base members together. Conventional techniques may cause the plurality of base members to be detached or become loose in a connecting section when the base member is bent.

Solution to Problem

An aspect of the present invention includes a display device including a non-transmissive display section and a transmissive display section, wherein the non-transmissive display section includes a base member including a first polyimide, the transmissive display section includes a base member including a second polyimide that has higher transparency than the first polyimide, the base member of the non-transmissive display section and the base member of the transmissive display section are connected in a connecting section, a bending portion is provided in the base member of the non-transmissive display section or the base member of the transmissive display section, and the connecting section and the bending portion do not overlap each other.

An aspect of the present invention includes a method of manufacturing a display device including a non-transmissive display section and a transmissive display section, a bending portion being provided in a base member of the non-transmissive display section or a base member of the transmissive display section, the method including: a non-transmissive resin layer forming step of forming a non-transmissive resin layer in the base member of the non-transmissive display section by stacking a plurality of resin films including a first polyimide resin film; a transmissive resin layer forming step of forming a transmissive resin layer in the base member of the transmissive display section by stacking a plurality of resin films including a second polyimide resin film; and a connecting section forming step of forming a connecting section that connects the base member of the non-transmissive display section and the base member of the transmissive display section in such a manner that the connecting section and the bending portion do not overlap each other by stacking a plurality of resin films in the non-transmissive resin layer and a plurality of resin films in the transmissive resin layer to.

Advantageous Effects of Invention

An aspect of the present invention is capable of preventing a plurality of base members that are connected together to form a base member from being detached or becoming loose in a connecting section even when the base member is bent.

DESCRIPTION OF EMBODIMENTS

Throughout the following description, expressions like "component A is in the same layer as component B" indicate that components A and B are formed in the same process or step (film forming step), expressions like "component A underlies/is below component B" indicate that component A is formed in an earlier process or step than component B, and expressions like "component A overlies/is on or above component B" indicate that component A is formed in a later process or step than component B.

Figure 1:
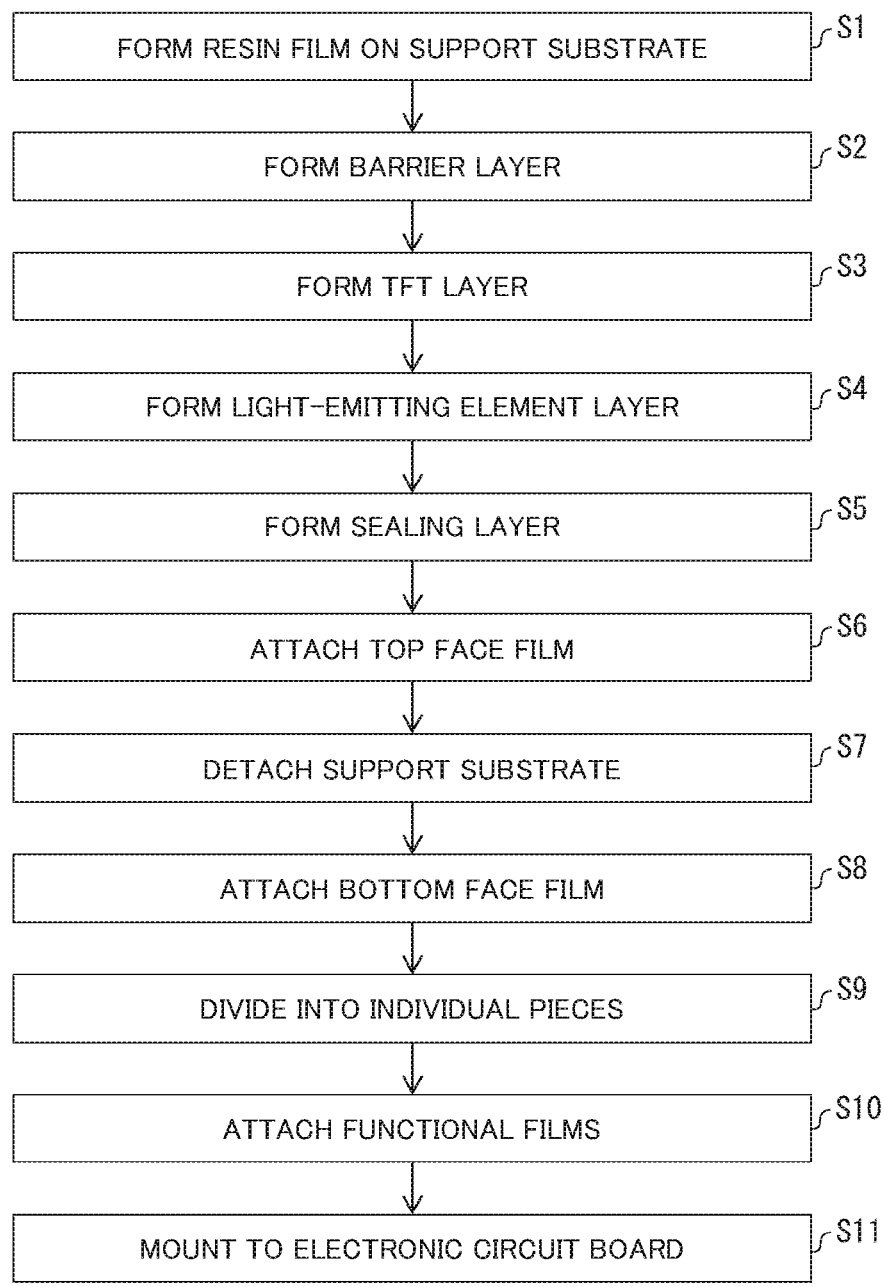
FIG. 1 is a flow chart representing an exemplary method of manufacturing a display device.
Figure 2:
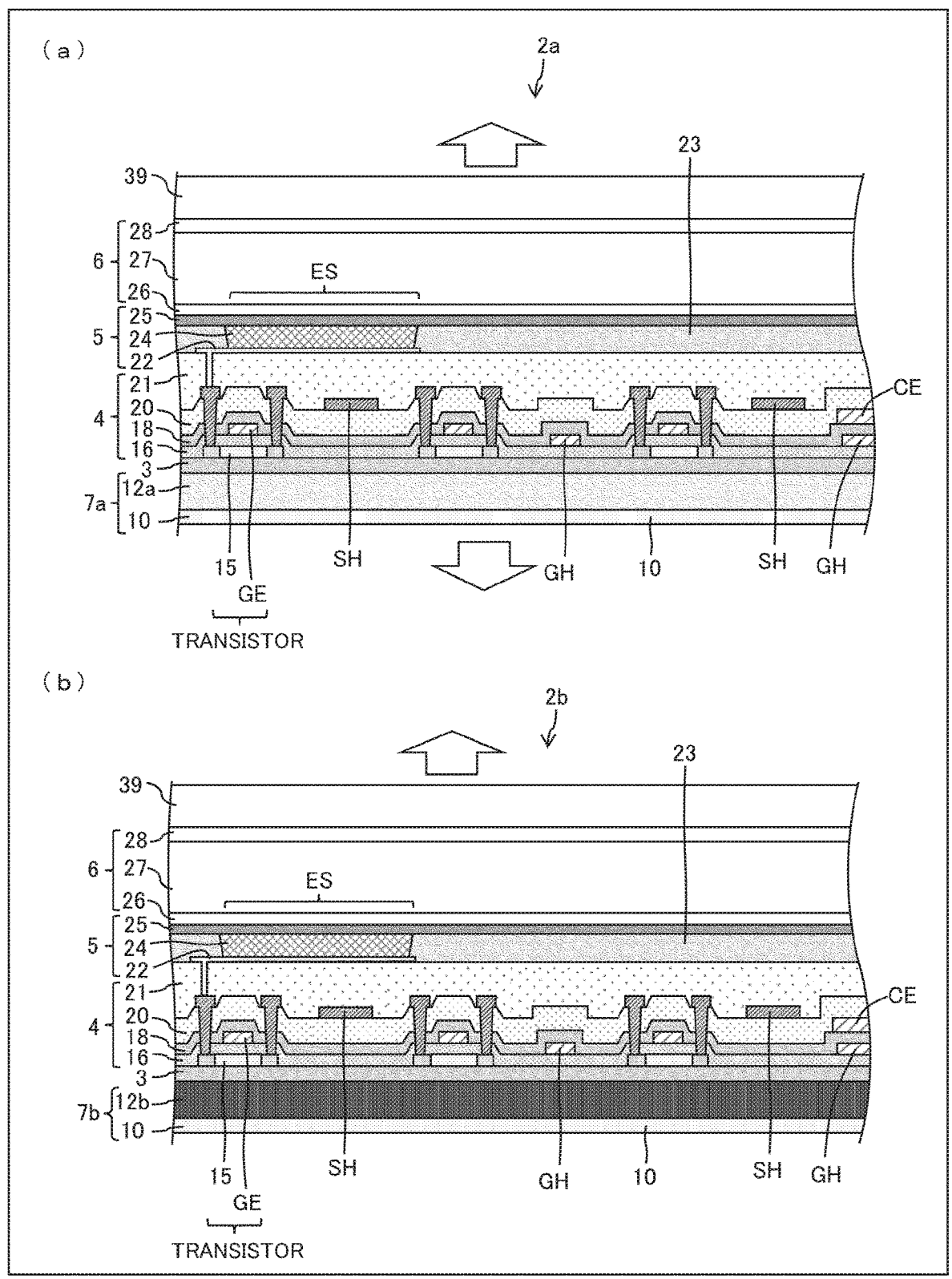
FIG. 2 is a set of cross-sectional views of exemplary structures of display sections of the display device.

FIG. 1 is a flow chart representing an exemplary method of manufacturing a display device. FIG. 2 is a set of cross-sectional views of structures of a transmissive display section 2a and a non-transmissive display section 2b of the display device.

To manufacture a flexible display device, resin layers (a transmissive resin layer 12a and a non-transmissive resin layer 12b) are formed on a transparent support substrate (e.g., mother glass) step S1 as shown in FIGS. 1 and 2. As shown in (a) and (b) of FIG. 2, the transmissive resin layer 12a is formed in the transmissive display section 2a, and the non-transmissive resin layer 12b is formed in the non-transmissive display section 2b. A barrier layer 3 is formed in step S2, a TFT layer 4 is formed in step S3, and a top-emission light-emitting element layer 5 is formed in step S4. Then, in step S5, a sealing layer 6 is formed. A top lace film is attached onto the sealing layer 6 in step S6.

In step S7, the support substrate is detached from the transmissive resin layer 12a and the non-transmissive resin layer 12b, for example, by laser irradiation. A bottom face film 10 is attached to the bottom faces of the transmissive resin layer 12a and the non-transmissive resin layer 12b in step S8. A laminate including the bottom face film 10, the transmissive resin layer 12a, the non-transmissive resin layer 12b, the barrier layer 3, the TFT layer 4, the light-emitting element layer 5, and the sealing layer 6 is divided in step S9, to obtain individual pieces. A functional film 39 is attached to the obtained individual pieces in step S10. An electronic circuit board (e.g., an IC chip on a FPC) is mounted in step S11 on a portion (terminal section) outside a display section where there is provided a plurality of subpixels (a non-display section or a frame). Steps S1 to S11 are performed by a display device manufacturing machine (including film-forming machines for performing steps S1 to S5).

The transmissive resin layer 12a and the non-transmissive resin layer 12b may be made of, for example, polyimide. A region formed by the transmissive resin layer 12a and the non-transmissive resin layer 12b may be replaced by two resin films (e.g., polyimide films) and an inorganic insulating film sandwiched between these resin films. The transmissive resin layer 12a and the non-transmissive resin layer 12b have different structures in the transmissive display section 2a and in the non-transmissive display section 2b. The transmissive resin layer 12a and the non-transmissive resin layer 12b will be described later in detail.

The barrier layer 3 prevents foreign materials such as water and oxygen from moving into the TFT layer 4 and the light-emitting element layer 5. The harrier layer 3 may include, for example, a silicon oxide film, a silicon nitride film, a silicon oxynitride film, or a stack of these films. These films can be formed by CVD.

The TFT layer 4 includes a semiconductor film 15, an inorganic insulating film 16 (gate insulating film) overlying the semiconductor film 15, a gate electrode GE and a gate line GH overlying the inorganic insulating film 16, an inorganic insulating film 18 overlying the gate electrode GE and the gate line GH, a capacitor electrode CE overlying the inorganic insulating film 18, an inorganic insulating film 20 overlying the capacitor electrode CE, a source line SH overlying the inorganic insulating film 20, and a planarization film 21 (interlayer insulating film) overlying the source line SH.

The semiconductor film 15 is made of, for example, a low-temperature polysilicon (LTPS) or an oxide semiconductor (e.g., In—Ga—Zn—O-based semiconductor). A transistor (TFT) is structured so as to include the semiconductor film 15 and the gate electrode GE. FIG. 2 shows a transistor with a top-gate structure. The transistor may alternatively have a bottom-gate structure.

The gate electrode GE, the gate line GH, the capacitor electrode CE, and the source line SH are made of, for example, a monolayer film of at least one of metals of aluminum, tungsten, molybdenum, tantalum, chromium, titanium, and copper or a stack of these films. The TFT layer 4 in FIG. 2 includes a single semiconductor layer and three metal layers.

The inorganic insulating films 16, 18, and 20 may be made of a silicon oxide (SiOx) film or a silicon nitride (SiNx) film formed by for example, CVD or a stack of these films. The planarization film 21 may be made of, for example, an organic material, such as polyimide or acrylic, that can be provided by coating.

The light-emitting element layer 5 includes an anode 22 overlying the planarization film 21, an insulating edge cover 23 covering an edge of the anode 22, an EL (electroluminescence) layer 24 overlying the edge cover 23, and a cathode 25 overlying the EL layer 24. The edge cover 23 is formed, for example, by patterning an applied organic material such as polyimide or acrylic by photolithography.

A light-emitting element ES (e.g., an OLED (organic light-emitting diode) or a QLED (quantum dot light-emitting diode)), including the insular anode 22, the EL layer 24, and the cathode 25, is formed for each subpixel in the light-emitting element layer 5. A subpixel circuit is formed in the TFT layer 4 to control the tight-emitting element ES.

The EL layer 24 includes, for example, a stack of a hole injection layer, a hole transport layer, a light-emitting layer, an electron transport layer, and an electron injection layer that are arranged in this order when viewed from below. The light-emitting layer is formed with an insular shape for each opening (each subpixel) of the edge cover 23 by vapor deposition or inkjet technology. Other layers are provided either in an insular manner or across all the openings (common layer). One or more of the hole injection layer, the hole transport layer, the electron transport layer, and the electron injection layer may be omitted.

A FMM (fine metal mask) is used in forming a light-emitting layer for OLEDs by vapor deposition. An FMM is a sheet of, for example, an invar material with numerous openings. An organic material that passes through an opening forms an insular light-emitting layer (corresponding to one subpixel).

An insular QLED light-emitting layer (corresponding to one subpixel) can formed, for example, by applying a solvent of diffused quantum dots by inkjet technology.

In the transmissive display section 2a, the anode 22 may be formed of, for example, a transparent conductive material such as a Mg—Ag alloy (super thin film), ITO, or IZO (indium zinc oxide) as shown in (a) of FIG. 2. The cathode 25 may be formed of a transparent conductive material such as a Mg—Ag alloy (super thin film), ITO, or IZO (indium zinc oxide). In addition, in the non-transmissive display section 2b, the cathode 25 may be formed of a light-reflective conductive material containing a stack of ITO (indium tin oxide) and either Ag (silver) or a Ag-containing alloy as shown in (b) of FIG. 2.

When the light-emitting element ES is an OLED, holes and electrons recombine in the light-emitting layer due to the drive current flowing between the anode 22 and the cathode 25, to produce excitons that fall to the ground state to emit tight. As shown in (a) of FIG. 2, When both the cathode 25 and the anode 22 are transparent, the light emitted by the EL layer 24 travels upward and downward, thereby achieving a transmissive display. Meanwhile, as shown in (b) of FIG. 2, when the cathode 25 is transparent, and the anode 22 is reflective, the light emitted by the EL layer 24 travels upward, thereby achieving a non-transmissive display (top emission).

When the light-emitting element ES is a QLED, holes and electrons recombine in the light-emitting layer due to the drive current flowing between the anode 22 and the cathode 25, to produce excitons that transition from the conduction band to the valence band of the quantum dot to emit light (fluorescence).

The light-emitting element layer 5 may include light-emitting elements, such as inorganic light-emitting diodes, other than the OLEDs and QLEDs described above.

The sealing layer 6 is transparent and includes an inorganic sealing film 26 covering the cathode 25, an organic buffer film 27 overlying the inorganic sealing film 26, and an inorganic sealing film 28 overlying the organic buffer film 27. The sealing layer 6, covering the light-emitting element layer 5, prevents foreign materials such as water and oxygen from moving into the light-emitting element layer 5.

The inorganic sealing film 26 and the inorganic sealing film 28 are inorganic insulating films and may each include, for example, a silicon oxide film, a silicon nitride film, a silicon oxynitride film, or a stack of these films. These films can be formed by CVD. The organic buffer film 27 is a transparent organic film that exhibits a planarization effect. The organic buffer film 27 may be made of an organic material, such as acrylic, that can be provided by coating.

The organic buffer film 27 may be formed, for example, by inkjet coating. There may be provided a bank in a non-display section to stop liquid drops.

The bottom face film 10 is attached to the bottom faces of the transmissive resin layer 12a and the non-transmissive resin layer 12b after the support substrate is detached, thereby providing a base member 7a for the transmissive display section and a base member 7b for the non-transmissive display section. The bottom face film 10 is, for example, a PET film so that the resultant display device is highly flexible. The functional film 39 has, for example, at least one of an optical compensation function, a touch sensor function, and a protection function.

The description has so far focused on the flexible display device. To manufacture a non-flexible display device, for example, stacking steps S2 to S5 are performed on a glass substrate before the manufacturing process proceeds to step S9, because it is generally unnecessary to form a resin layer and replace base members.

Embodiment 1

Figure 3:
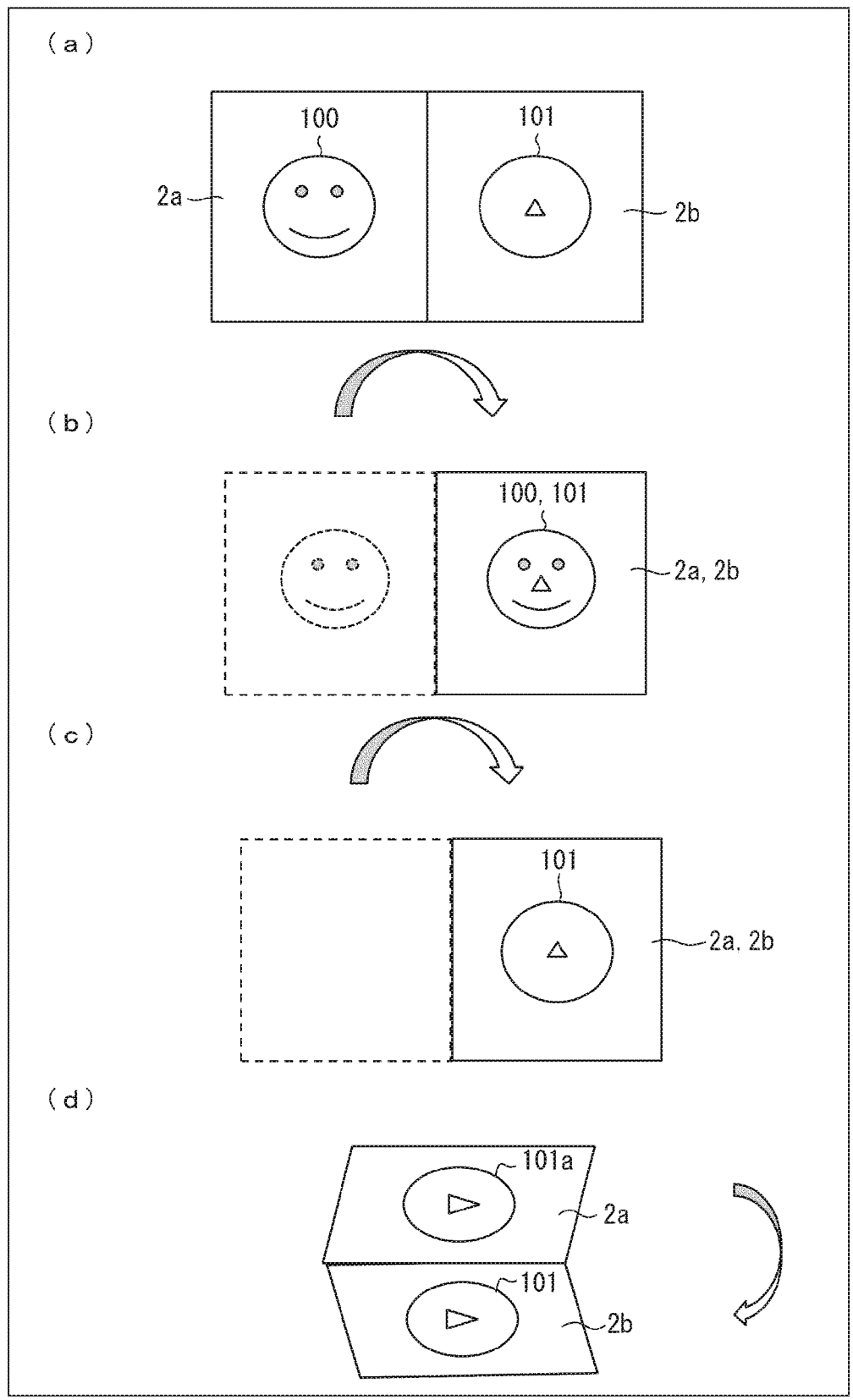
FIG. 3 is a set of illustrations of an exemplary image displays on a transmissive display section and a non-transmissive display section.

A more specific description is now given of the transmissive display section 2a and the non-transmissive display section 2b of the display device in accordance with Embodiment 1. FIG. 3 is a set of illustrations of an exemplary image displays on the transmissive display section 2a and the non-transmissive display section 2b. As shown in (a) of FIG. 3, the transmissive display section 2a and the non-transmissive display section 2b provide a foldable display unit where the transmissive display section 2a and the non-transmissive display section 2b are connected together so as to form a plane when opened. This structure enables the display unit to be folded up in such a manner that either one of the transmissive display section 2a and the non-transmissive display section 2b can be placed over the other so as to serve as a safety cover for the other.

Portion (a) of FIG. 3 shows the transmissive display section 2a and the non-transmissive display section 2b being opened up and individually displaying images 100 and 101 respectively as an example of image displays produced by the transmissive display section 2a and the non-transmissive display section 2b. When the transmissive display section 2a is structured so as to be placed over the non-transmissive display section 2b as shown in (b) to (d) of FIG. 3, the image 100 produced by the transmissive display section 2a can be superimposed on the image 101 produced by the non-transmissive display section 2b as shown in (b) of FIG. 3. When the transmissive display section 2a is placed over the non-transmissive display section 2b with the transmissive display section 2a displaying no image 100 as shown in (c) of FIG. 3, only the image 101 produced by the non-transmissive display section 2b is visible through the transmissive display section 2a. The transmissive display section 2a may be structured so as to have a bottom face (functional film 39) that turns non-transmissive when the transmissive display section 2a is placed over the non-transmissive display section 2b. This structure enables the transmissive display section 2a to reflect, off the bottom face thereof, the image 101 produced by the non-transmissive display section 2b, thereby producing a reflection image 101a on the transmissive display section 2a, as shown in (d) of FIG. 3.

The examples described above illustrate a folding mechanism in which the transmissive display section 2a is placed over the non-transmissive display section 2b. Alternatively, the folding mechanism may be such that the non-transmissive display section 2b can be placed over the transmissive display section 2a.

As a more specific example, the transmissive display section 2a and the non-transmissive display section 2b may each have a touch panel with a touch sensor function (Example 1) on those surfaces (functional films 39) of the transmissive display section 2a and the non-transmissive display section 2b that become visible when the transmissive display section 2a and the non-transmissive display section 2b are opened up. This structure enables user operations on image display modes, for example, so as to draw, on the touch panel surfaces that become visible when the transmissive display section 2a and the non-transmissive display section 2b are opened up, the images 100 and 101 for display on the transmissive display section 2a and the non-transmissive display section 2b.

Figure 4:
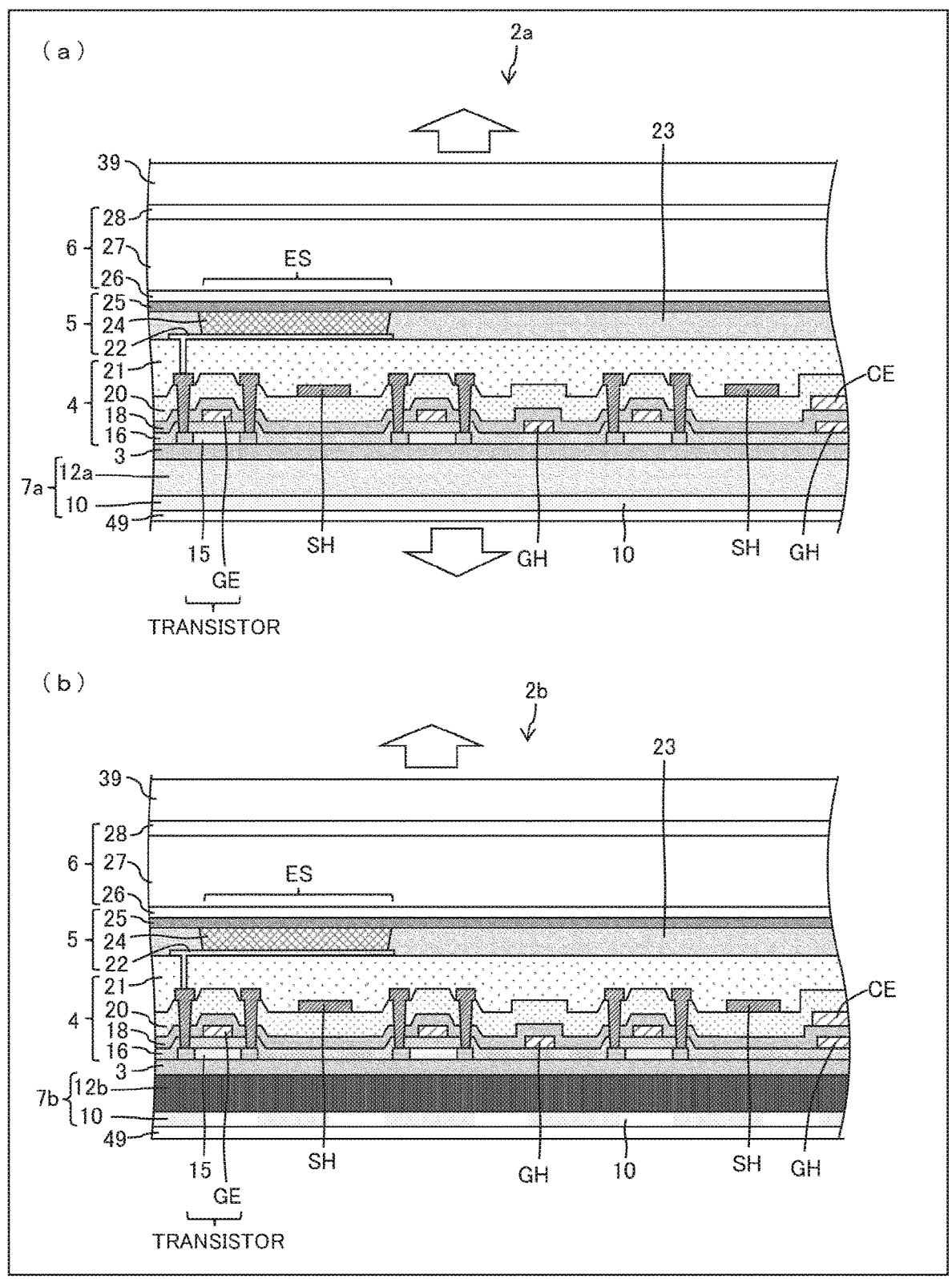
FIG. 4 is a set of cross-sectional views of other exemplary structures of the transmissive display section and the non-transmissive display section of the display device.

As Example 2, the transmissive display section 2a and the non-transmissive display section 2b may each include a touch panel on both sides thereof as shown in FIG. 4. FIG. 4 is a set of cross-sectional views of other exemplary structures of the transmissive display section 2a and the non-transmissive display section 2b of the display device. The transmissive display section 2a and the non-transmissive display section 2b may each include an additional functional film 49 with a touch sensor function under the bottom the film 10 as shown in (a) and (b) of FIG. 4. If only those surfaces that become visible when the transmissive display section 2a and the non-transmissive display section 2b are opened up serve as touch panels, the touch panel surfaces are hidden inside the display device when the transmissive display section 2a is placed over the non-transmissive display section 2b as shown in (b) to (d) of FIG. 3. In contrast, if the functional films 49 are provided opposite the functional films 39 in the transmissive display section 2a and the non-transmissive display section 2b as shown in FIG. 4, those surfaces opposite the surfaces that become visible when the transmissive display section 2a and the non-transmissive display section 2b are opened up can also serve as touch panels. This structure enables user operations on image display modes of the transmissive display section 2a and the non-transmissive display section 2b via the touch panels provided by the functional films 49 even when the transmissive display section 2a is placed over the non-transmissive display section 2b. Similarly to the functional film 39, the functional film 49 may further have an optical compensation function. This additional function enables a desirable image display on the touch panel.

Figure 5:
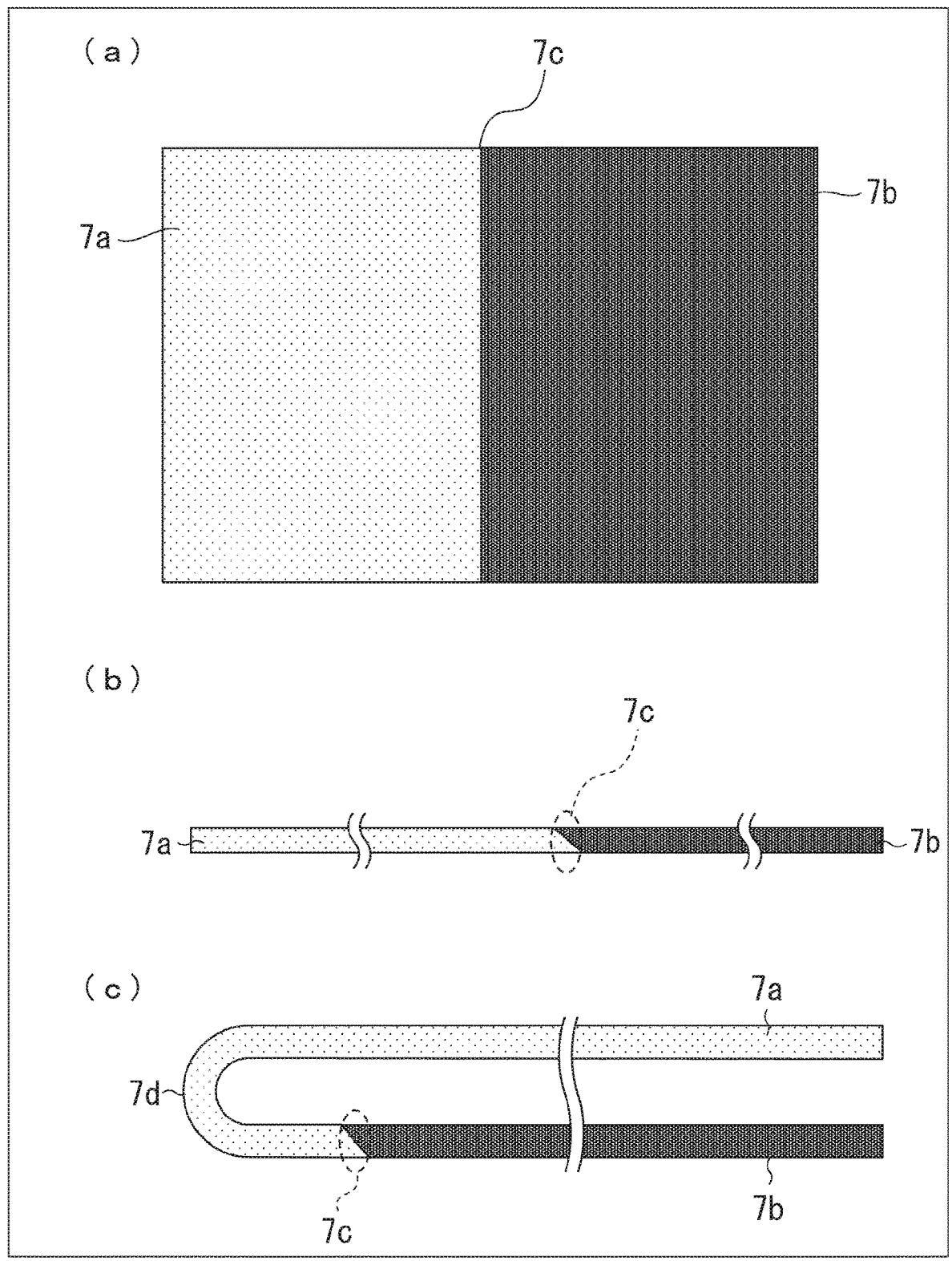
FIG. 5 is a top view and cross-sectional views of a base member of the transmissive display section and a base member of the non-transmissive display section.
Figure 6:
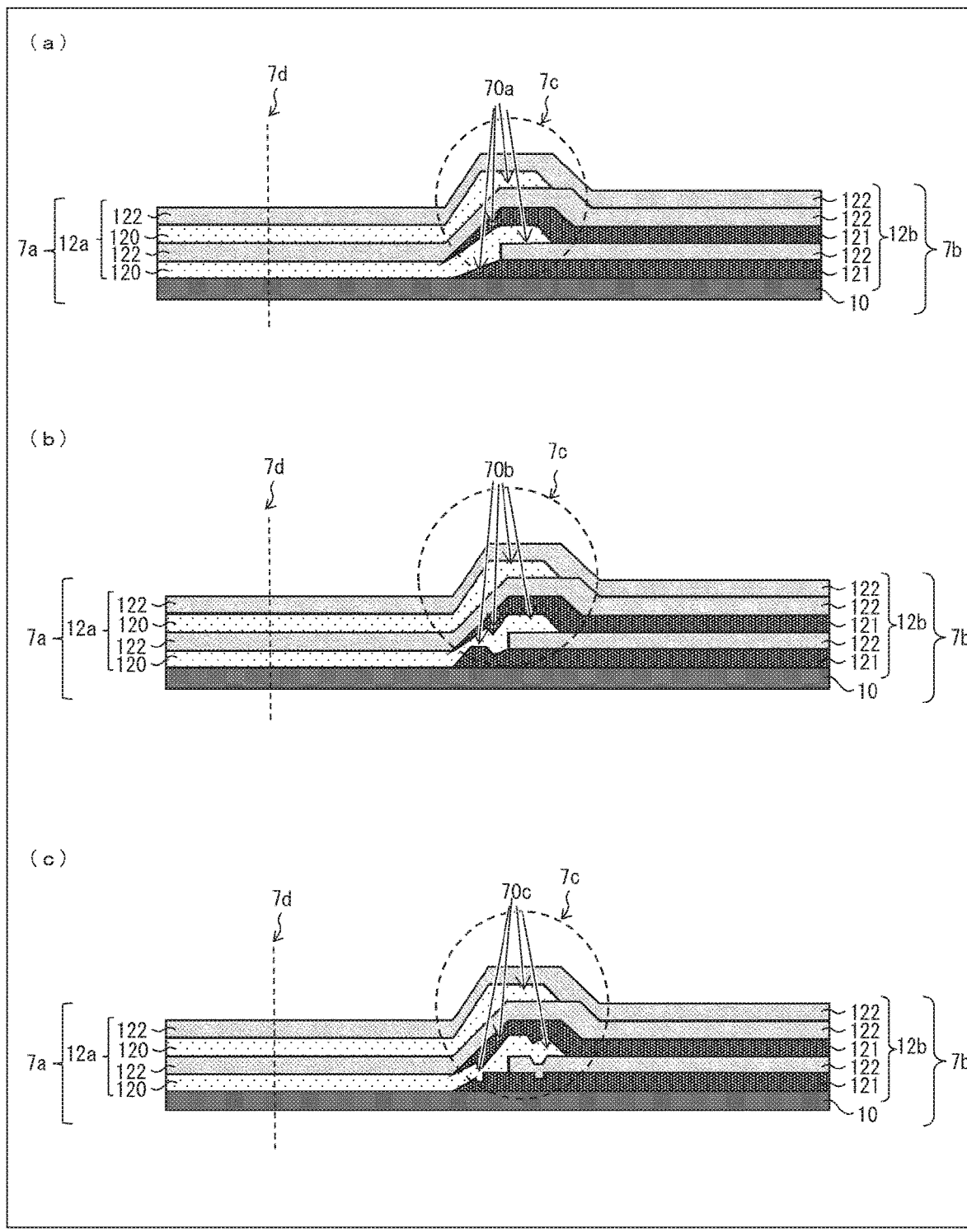
FIG. 6 is a set of enlarged views of a connecting section.

Next, a description is now given of the base member 7a of the transmissive display section and the base member 7b of the non-transmissive display section with reference to FIGS. 5 and 6. Portion (a) of FIG. 5 is a top view of the base member 7a of the transmissive display section and the base member 7b of the non-transmissive display section. Portions (b) and (c) of FIG. 5 are cross-sectional views of the base member 7a of the transmissive display section and the base member 7b of the non-transmissive display section. The base member 7b of the non-transmissive display section contains a first polyimide, and the base member 7a of the transmissive display section contains a second polyimide that exhibits higher transparency than the first polyimide. The base member 7b and the base member 7a are connected in a connecting section 7c as shown in (a) of FIG. 5. The base member 7a of the transmissive display section includes a bending portion 7d in such a position that the connecting section 7c does not overlap the bending portion 7d, as shown in (c) of FIG. 5. This structure, in which the connecting section 7c does not overlap the bending portion 7d, prevents the base member 7a of the transmissive display section and the base member 7b of the non-transmissive display section from being detached in the connecting section 7c even when the transmissive display section 2a is bent. The first polyimide is, for example, a colored polyimide. The second polyimide is, for example, a non-colored polyimide and may alternatively be colored to such a degree that the base member 7a of the transmissive display section can function as a transmissive panel.

The examples described above assume that the base member 7a of the transmissive display section is disposed on the left-hand side and that the base member 7b of the non-transmissive display section is disposed on the right-hand side. Alternatively, the base member 7b of the non-transmissive display section may be disposed on the left-hand side, and the base member 7a of the transmissive display section may be disposed on the right-hand side. The examples describe the base member 7a of the transmissive display section as being configured bendable in the bending portion 7d thereof. Alternatively, the bending portion 7d may be included in the base member 7b of the non-transmissive display section so that the base member 7b of the non-transmissive display section can be bent in the bending portion 7d thereof and the base member 7b is located above the base member 7a of the transmissive display section. The examples describe the connecting section 7c as being located to the right of the bending portion 7d. Alternatively, the connecting section 7c may be located to the left of the bending portion 7d so long as the connecting section 7c does not overlap the bending portion 7d. In such a structure, however, when the base member 7a of the transmissive display section is bent, the connecting section 7c is on top of the base member 7a of the transmissive display section so that not the entire screen of the transmissive display section 2a is visible on the top surface. Additionally, not the entire screen of the lower, non-transmissive display section 2b is visible through the screen of the transmissive display section 2a when the upper, transmissive display section 2a produces no display. In contrast, by providing a bending portion 7d in such a manner that the connecting section 7c is located on the bottom of the base member 7a of the transmissive display section when the base member 7a of the transmissive display section is bent as shown in (c) of FIG. 5, the screen of the transmissive display section 2a can be displayed on the entire top surface. In addition, by doing so, the entire screen of the lower, non-transmissive display section 2b is visible through the screen of the transmissive display section 2a when the upper, transmissive display section 2a produces no display.

FIG. 6 is a set of enlarged views of the connecting section 7c. The base member 7a of the transmissive display section includes the transmissive resin layer 12a in which there is provided a stack of resin films including second polyimide resin films 120 as shown in (a) of FIG. 6. The base member 7b of the non-transmissive display section includes the non-transmissive resin layer 12b in which there is provided a stack of resin films including first polyimide resin films 121. In the connecting section 7c is there provided a convex-concave locking section 70a in which at least one resin film in one of the transmissive resin layer 12a and the non-transmissive resin layer 12b is locked onto at least one resin film in the other one of the resin layers. The connecting section 7c and the bending portion 7d are configured not to overlap each other as shown in (a) to (c) of FIG. 6.

The second polyimide resin films 120 and the first polyimide resin films 121 do not adhere well to each other if the resin films 120 and 121 are simply stacked. In contrast, since the convex-concave locking section 70a shown in (a) of FIG. 6 locks (anchors) one of the resin films to the other resin film, the second polyimide resin films 120 and the first polyimide resin films 121 adhere better to each other even if the resin films 120 and 121 are stacked. This structure increases adhesion strength between the transmissive resin layer 12a and the non-transmissive resin layer 12b. The increased adhesion strength prevents the base member 7a of the transmissive display section and the base member 7b of the non-transmissive display section from being detached in the connecting section 7c in a more suitable manner even when the transmissive display section 2a is bent.

Either one or both of the transmissive resin layer 12a and the non-transmissive resin layer 12b may include at least one inorganic insulating film 122 as shown in (a) of FIG. 6. The at least one inorganic insulating film 122 may be removed in the connecting section 7c so that the second polyimide resin films 120 and the first polyimide resin films 121 are connected directly to each other in the connecting section 7c. In such cases, the convex-concave locking section 70a can similarly lock, for example, the first polyimide resin film 121 under the second polyimide resin film 120 as shown in (a) of FIG. 6, thereby increasing adherence and adhesion strength between the first polyimide resin films 121 and the second polyimide resin films 120.

Portion (a) of FIG. 6 shows the transmissive resin layer 12a including two second polyimide resin films 120 and the non-transmissive resin layer 12b including two first polyimide resin films 121. This is however not the only possible implementation of the present embodiment of the invention. Alternatively, in the present embodiment, the transmissive resin layer 12a may include only one second polyimide resin film 120, and the non-transmissive resin layer 12b may include only one first polyimide resin film 121. Preferably, the transmissive resin layer 12a includes two second polyimide resin films 120, and the non-transmissive resin layer 12b includes two first polyimide resin films 121. The provision of two second polyimide resin films 120 in the transmissive resin layer 12a and two first polyimide resin films 121 in the non-transmissive resin layer 12b adds to the thicknesses of the transmissive resin layer 12a and the non-transmissive resin layer 12b. This structure adds to the thicknesses of the base member 7a of the transmissive display section and the base member 7b of the non-transmissive display section, thereby restraining the base member 7a of the transmissive display section and the base member 7b of the non-transmissive display section from breaking. Additionally, if the transmissive resin layer 12a includes two second polyimide resin films 120, and the non-transmissive resin layer 12b includes two first polyimide resin films 121 as described above, for example, those first and second polyimide resin films 121 and 120 that are in lower layers in the stack may have relatively high viscosity, and those first and second polyimide resin films 121 and 120 that are in upper layers in the stack may have relatively low viscosity. This structure enables suitable stacking of these resin films.

As shown in (b) and (c) of FIG. 6, the second polyimide resin films 120 preferably have a different thickness in locking sections 70b and 70c than the second polyimide resin films 120 have in locations other than the locking sections 70b and 70c. Additionally, the first polyimide resin films 121 preferably have a different thickness in the locking sections 70b and 70c than the first polyimide resin films 121 have in locations other than the locking sections 70b and 70c. This structure enhances the convex-concave features of the locking sections 70b and 70c, so that either the first polyimide resin films 121 or the second polyimide resin films 120 can be more suitably locked onto the others. The structure thereby increases adhesion strength between the transmissive resin layer 12a including the second polyimide resin films 120 and the non-transmissive resin layer 12b including the first polyimide resin films 121. It will be described later how the second polyimide resin films 120 and the first polyimide resin films 121 are rendered to have a different thickness in the locking sections 70b and 70c than in locations other than the locking sections 70b and 70c.

The examples described above assume that the transmissive resin layer 12a and the non-transmissive resin layer 12b each have resin films therein locked onto those resin films in the other resin layer in the locking sections 70a, 70b, and 70c. This is however not the only possible implementation of the present embodiment of the invention. Alternatively, in the present embodiment, only either one of the transmissive resin layer 12a and the non-transmissive resin layer 12b may have at least one resin film therein locked onto at least one resin film in the other resin layer in the locking sections 70a, 70b, and 70c. This structure can similarly increase adhesion strength between the transmissive resin layer 12a and the non-transmissive resin layer 12b.

A description is now given of a method of manufacturing resin layers in base members of the display device. In other words, step S1 in FIG. 1 is described in detail.

To manufacture a transmissive resin layer and a non-transmissive resin layer as shown in FIG. 6, a resin film containing the first polyimide resin films is stacked in step S1a to form a non-transmissive resin layer in the base member of the non-transmissive display section (non-transmissive resin layer forming step). A resin film containing the second polyimide resin films is then stacked in step S1b to form a transmissive resin layer in the base member of the transmissive display section (transmissive resin layer forming step). In step S1c, the resin films in the transmissive resin layer and the resin films in the non-transmissive resin layer are stacked to form a connecting section for connecting the base member of the transmissive display section and the base member of the non-transmissive display section in such a manner that the connecting section does not overlap the bending portion (connecting section forming step).

Steps S1a to 1c are followed by steps S2 to 11 shown in FIG. 1. At least steps S2 to 11, except for step S4 of forming anodes in the light-emitting element layer, do not need to distinguish between the transmissive display section and the non-transmissive display section and may be performed commonly on the transmissive display section and the non-transmissive display section. In other words, at least those components other than the resin layer and the anodes in the light-emitting element layer may be formed without having to distinguish between the transmissive display section and the non-transmissive display section.

Step S4 of forming anodes in the light-emitting element layer may additionally be performed commonly on, without having to distinguish between, the transmissive display section and the non-transmissive display section. Such step S4 improves the efficiency of the manufacture of the transmissive display section and the non-transmissive display section. In such step S4, for example, the anodes in both the transmissive display section and the non-transmissive display section may be formed of the transparent conductive material of which the transmissive display section is formed. Even when the anodes in the non-transmissive display section are formed of a transparent conductive material, the non-transmissive display section can still operate as a non-transmissive display section of top-emission type because the transparent conductive material, if translucent, reflects some light. If the anodes in the transmissive display section are formed of a transparent conductive material and the anodes in the non-transmissive display section are formed of a non-transparent conductive material, however, a display device can be manufactured in which the transmissive display section and the non-transmissive display section operate as a transmissive display section and a non-transmissive display section respectively in a more suitable manner.

Steps S1a to 1c may be performed in other orders so long as the steps can solve the technical problem to be solved by the present application. Steps S1a to 1c are preferably performed simultaneously. For instance, as shown in FIG. 6, when the transmissive resin layer 12a and the non-transmissive resin layer 12b are to be formed on the left-hand side and on the right-hand side respectively, resin films, including both of these resin layers, may be stacked one by one starting from the bottom, to form these resin layers. In the case of (a) of FIG. 6, both of these resin layers may be formed by stacking in the order of, for example, a first polyimide resin film 121, an inorganic insulating film 122, a second polyimide resin film 120, another first polyimide resin film 121 and so on.

These resin layers may be formed by further stacking inorganic insulating films in step S1a (non-transmissive resin layer forming step) and step S1b (transmissive resin layer forming step). The second polyimide resin films, the first polyimide resin films, and the inorganic insulating films may be formed, for example, by a publicly known method including a coating method that involves the use of a slit coater.

In step S1c (connecting section forming step), at least one resin film in one of the transmissive resin layer and the non-transmissive resin layer is preferably locked onto at least one resin film in the other one of the resin layers as shown in FIG. 6, to form a connecting section including a convex-concave locking section.

In step S1c (connecting section forming step), the first polyimide resin films preferably have a different thickness in the locking section than in locations other than the locking section. In addition, the second polyimide resin films preferably have a different thickness in the locking section than in locations other than the locking section. Examples 3 and 4 below describe example methods by which the first polyimide resin film and the second polyimide resin film are rendered to have a different thickness in the locking section than in locations other than the locking section in this manner.

Figure 7:
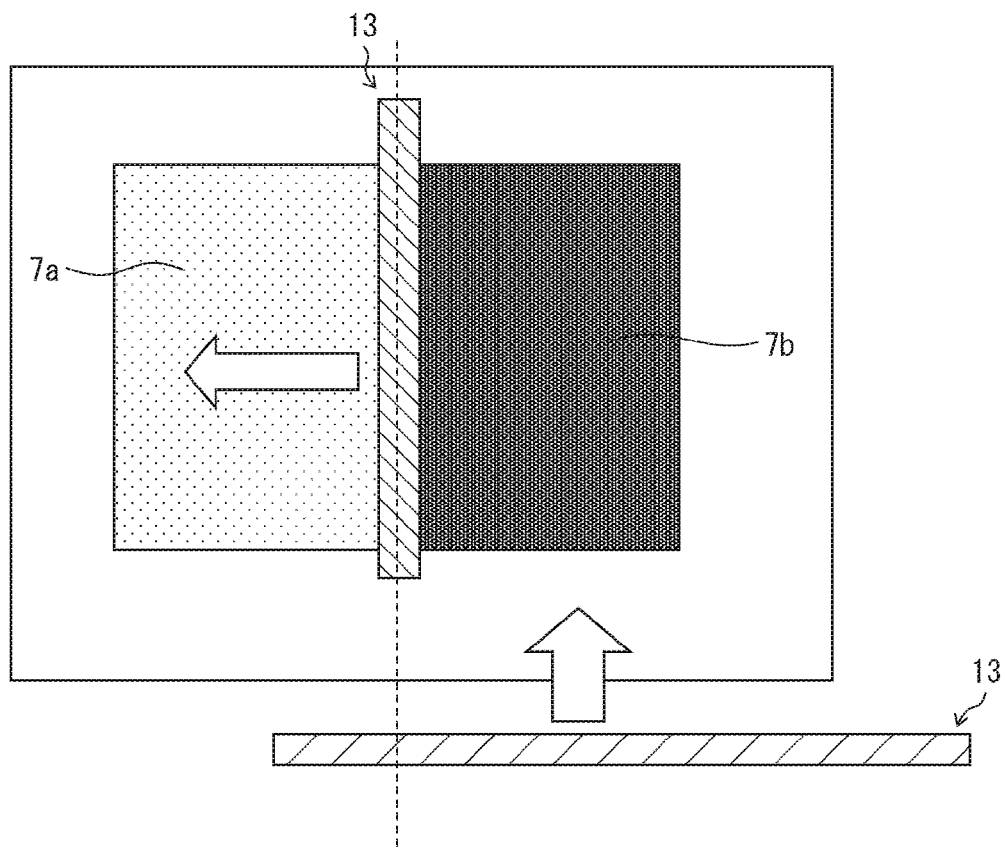
FIG. 7 is a diagram of an exemplary method of forming a locking section using a slit coater.

Example 3 describes a method that involves the use of a slit coater with reference to (b) of FIG. 6 and FIG. 7. FIG. 7 is a diagram of an exemplary method of forming a locking section using a slit coater. Example 3 involves the adjustment of the amount of the resin ejected from a nozzle of the slit coater in forming the second polyimide resin films 120 and the first polyimide resin films 121 in such a manner that the second polyimide resin films 120 and the first polyimide resin films 121 can have a different coating thickness in the locking section 70b (slit coater hopping). For instance, the first polyimide resin film 121 is rendered to horizontally vary in coating thickness, by moving a slit coater 13 upward while the slit coater 13 is ejecting a resin in forming the base member 7b of the non-transmissive display section, as shown in FIG. 7. Additionally, the second polyimide resin film 120 is rendered to vertically vary in coating thickness, by moving the slit coater 13 to the left while the slit coater 13 is ejecting a resin in forming the base member 7a of the transmissive display section. This technique enables the formation of the step-like, convex-concave locking section 70*b* as shown in (b) of FIG. 6. As described here, if the slit coater is used, the second polyimide resin films 120 and the first polyimide resin films 121 are rendered to have a different thickness in the locking section 70*b* than in locations other than the locking section 70*b* in forming the second polyimide resin films 120 and the first polyimide resin films 121.

Example 4 describes a method that involves laser fabrication with reference to (c) of FIG. 6. In Example 4, after the second polyimide resin films 120 and the first polyimide resin films 121 are formed by coating, the surfaces of these resin films in the locking section 70*c* are subjected to laser fabrication (e.g., patterned under a laser beam). This technique facilitates the formation of the convex-concave locking section 70*c* with a more step-like shape as shown in (c) of FIG. 6.

The examples described above assume that Examples 3 and 4 are implemented separately. Alternatively, Examples 3 and 4 may be combined in the present embodiment. For instance, the locking section 70*b* may be formed by slit coater hopping as in Example 3 and thereafter subjected to laser fabrication to form the locking section 70*c*. This technique enhances the convex-concave features of the locking section 70*c*, so that either the first polyimide resin films or the second polyimide resin films can be more suitably locked onto the others. The technique thereby further increases adhesion strength between the transmissive resin layer 12*a* including the second polyimide resin films 120 and the non-transmissive resin layer 12*b* including the first polyimide resin films 121.

General Description

The display device in accordance with the present embodiment may include any electro-optical elements the luminance and transmittance of Which are controlled through current. The display device in accordance with the present embodiment may be, for example, an organic EL (electroluminescence) display device including OLEDs (organic light-emitting diodes) as electro-optical elements, an inorganic EL display device including inorganic light-emitting diodes as electro-optical elements, or a QLED display device including QLEDs (quantum dot light-emitting diodes) as electro-optical elements.

Aspect 1

A display device including a non-transmissive display section and a transmissive display section, wherein the non-transmissive display section includes a base member including a first polyimide, the transmissive display section includes a base member including a second polyimide that has higher transparency than the first polyimide, the base member of the non-transmissive display section and the base member of the transmissive display section are connected in a connecting section, a bending portion is provided in the base member of the non-transmissive display section or the base member of the transmissive display section, and the connecting section and the bending portion do not overlap each other.

Aspect 2

A display device of, for example, aspect 1, wherein the base member of the non-transmissive display section includes a non-transmissive resin layer in which a plurality of resin films including a first polyimide resin film are stacked, the base member of the transmissive display section includes a transmissive resin layer in which a plurality of resin films including a second polyimide resin film are stacked, and the connecting section includes a convex-concave locking section in which at least one resin film in one of the non-transmissive resin layer and the transmissive resin layer is locked onto at least one resin film in another one of the non-transmissive resin layer and the transmissive resin layer.

Aspect 3

The display device of, for example, aspect 2, wherein the first polyimide resin film has a different thickness in the locking section than in locations other than the locking section, and the second polyimide resin film has a different thickness in the locking section than in locations other than the locking section.

Aspect 4

The display device of, for example, aspect 2 or 3, wherein the non-transmissive resin layer includes two of the first polyimide resin films, and the transmissive resin layer includes two of the second polyimide resin films.

Aspect 5

The display device of, for example, any one of aspects 2 to 4, wherein at least one of the non-transmissive resin layer and the transmissive resin layer includes at least one inorganic insulating film, and the at least one inorganic insulating film is removed in the connecting section in such a manner that the first polyimide resin film and the second polyimide resin film are connected directly to each other.

Aspect 6

A method of manufacturing a display device including a non-transmissive display section and a transmissive display section, a bending portion being provided in a base member of the non-transmissive display section or a base member of the transmissive display section, the method including: a non-transmissive resin layer forming step of forming a non-transmissive resin layer in the base member of the non-transmissive display section by stacking a plurality of resin films including a first polyimide resin film; a transmissive resin layer forming step of forming a transmissive resin layer in the base member of the transmissive display section by stacking a plurality of resin films including a second polyimide resin film; and a connecting section forming step of forming a connecting section that connects the base member of the non-transmissive display section and the base member of the transmissive display section in such a manner that the connecting section and the bending portion do not overlap each other by stacking the plurality of resin films in the non-transmissive resin layer and the plurality of resin films in the transmissive resin layer.

Aspect 7

The method of manufacturing a display device of, for example, aspect 6, wherein in the connecting section forming step, at least one resin film in one of the non-transmissive resin layer and the transmissive resin layer is locked onto at least one resin film in another one of the non-transmissive resin layer and the transmissive resin layer, to form the connecting section with a convex-concave locking section.

Aspect 8

The method of manufacturing a display device of, for example, aspect 7, wherein in the connecting section forming step, an amount of a resin ejected from a nozzle of a slit coater to form the first polyimide resin film and the second polyimide resin film in the locking section is adjusted to make a thickness of the first polyimide resin film in the locking section different from that in locations other than the locking section and to make a thickness of the second polyimide resin film in the locking section different from that in locations other than the locking section.

Aspect 9

The method of manufacturing a display device of, for example, aspect 7, wherein in the connecting section forming step, the first polyimide resin film and the second polyimide resin film are subjected to laser fabrication, to make a thickness of the first polyimide resin film in the locking section different from that in locations other than the locking section and to make a thickness of the second polyimide resin film in the locking section different from that in locations other than the locking section.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
   a non-transmissive display section; and
   a transmissive display section,
   wherein the non-transmissive display section includes a base member including a first polyimide,
   the transmissive display section includes a base member including a second polyimide that has higher transparency than the first polyimide,
   the base member of the non-transmissive display section and the base member of the transmissive display section are connected in a connecting section,
   a bending portion is provided in the base member of the non-transmissive display section or the base member of the transmissive display section, and
   the connecting section and the bending portion do not overlap each other,
   wherein the base member of the non-transmissive display section includes a non-transmissive resin layer in which a plurality of resin films including a first polyimide resin film are stacked,
   the base member of the transmissive display section includes a transmissive resin layer in which a plurality of resin films including a second polyimide resin film are stacked, and
   the connecting section includes a convex-concave locking section in which at least one resin film in one of the non-transmissive resin layer and the transmissive resin layer is locked onto at least one resin film in another one of the non-transmissive resin layer and the transmissive resin layer,
   wherein the convex-concave locking section anchors the at least one resin film in one of the non-transmissive resin layer and the transmissive resin layer to the at least one resin film in another one of the non-transmissive resin layer and the transmissive resin layer.

2. The display device according to claim 1, wherein
   the first polyimide resin film has a different thickness in the convex-concave locking section than in locations other than the convex-concave locking section, and
   the second polyimide resin film has a different thickness in the convex-concave locking section than in locations other than the convex-concave locking section.

3. The display device according to claim 1, wherein
   the first polyimide resin film in the non-transmissive resin layer includes two first polyimide resin films, and
   the second polyimide resin film in the transmissive resin layer includes two second polyimide resin films.

4. The display device according to claim 1, wherein
   at least one of the non-transmissive resin layer and the transmissive resin layer includes at least one inorganic insulating film, and
   the at least one inorganic insulating film is removed in the connecting section in such a manner that the first polyimide resin film and the second polyimide resin film are connected directly to each other.

5. A method of manufacturing a display device including a non-transmissive display section and a transmissive display section, a bending portion being provided in a base member of the non-transmissive display section or a base member of the transmissive display section, the method comprising:
   forming a non-transmissive resin layer in the base member of the non-transmissive display section by stacking a plurality of resin films including a first polyimide resin film;
   forming a transmissive resin layer in the base member of the transmissive display section by stacking a plurality of resin films including a second polyimide resin film; and
   forming a connecting section that connects the base member of the non-transmissive display section and the base member of the transmissive display section in such a manner that the connecting section and the bending portion do not overlap each other by stacking the plurality of resin films in the non-transmissive resin layer and the plurality of resin films in the transmissive resin layer,
   wherein in forming the connecting section, at least one resin film in one of the non-transmissive resin layer and the transmissive resin layer is locked onto at least one resin film in another one of the non-transmissive resin layer and the transmissive resin layer, to form the connecting section with a convex-concave locking section,
   wherein the convex-concave locking section anchors the at least one resin film in one of the non-transmissive resin layer and the transmissive resin layer to the at least one resin film in another one of the non-transmissive resin layer and the transmissive resin layer.

6. The method of manufacturing a display device according to claim 5,
   wherein in forming the connecting section, an amount of a resin ejected from a nozzle of a slit coater to form the first polyimide resin film and the second polyimide resin film in the convex-concave locking section is adjusted to cause a thickness of the first polyimide resin film in the convex-concave locking section different from that in locations other than the convex-concave locking section and to cause a thickness of the second polyimide resin film in the convex-concave locking section different from that in locations other than the convex-concave locking section.

7. The method of manufacturing a display device according to claim 5,
   wherein in forming the connecting section, the first polyimide resin film and the second polyimide resin film are subjected to laser fabrication, to cause a thickness of the first polyimide resin film in the convex-concave locking section different from that in locations other than the convex-concave locking section and to cause a thickness of the second polyimide resin film in the convex-concave locking section different from that in locations other than the convex-concave locking section.

* * * * *